(12) United States Patent
Chang et al.

(10) Patent No.: US 12,347,746 B2
(45) Date of Patent: Jul. 1, 2025

(54) HEAT DISSIPATION DEVICE

(71) Applicant: Auras Technology Co., Ltd., New Taipei (TW)

(72) Inventors: Cheng-Ju Chang, New Taipei (TW); Wan-Hsuan Lin, New Taipei (TW); Chung-Chien Su, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 326 days.

(21) Appl. No.: 18/186,641

(22) Filed: Mar. 20, 2023

(65) Prior Publication Data

US 2023/0307317 A1    Sep. 28, 2023

Related U.S. Application Data

(60) Provisional application No. 63/323,298, filed on Mar. 24, 2022.

(51) Int. Cl.
| | |
|---|---|
| *H01L 23/427* | (2006.01) |
| *F28F 1/12* | (2006.01) |
| *H01L 23/40* | (2006.01) |
| *H05K 7/20* | (2006.01) |

(52) U.S. Cl.
CPC ............... *H01L 23/427* (2013.01); *F28F 1/12* (2013.01); *H01L 23/4006* (2013.01); *H05K 7/20336* (2013.01); *H05K 7/20509* (2013.01); *H01L 2023/4068* (2013.01); *H01L 2023/4087* (2013.01)

(58) Field of Classification Search
CPC ............... H01L 23/427; H01L 23/4006; H01L 2023/4068; H01L 2023/4087; F28F 1/12
USPC ........................................ 165/104.21, 104.33
See application file for complete search history.

(56) References Cited

U.S. PATENT DOCUMENTS

| | | | |
|---|---|---|---|
| 7,269,014 B1 * | 9/2007 | Zhao ..................... | H01L 23/467 361/720 |
| 7,753,110 B2 * | 7/2010 | Yang ................... | F28D 15/0275 165/104.33 |
| 2007/0145572 A1 * | 6/2007 | Chen ................... | H01L 23/4006 257/E23.084 |

\* cited by examiner

*Primary Examiner* — Joel M Attey
(74) *Attorney, Agent, or Firm* — MUNCY, GEISSLER, OLDS & LOWE, P.C.

(57) ABSTRACT

A heat dissipation device includes a main fixed base plate, a main heat pipe set, a lower heat dissipation fin set and an upper heat dissipation module. The main heat pipe set is fixed on the main fixed base plate, and the lower heat dissipation fin set is also fixed on the main fixed base plate, and the main heat pipe set passes through the lower heat dissipation fin set, and is exposed on the lower heat dissipation fin set. In addition, the upper heat dissipation module is detachably installed on the lower heat dissipation fin set and contacts the main heat pipe set.

9 Claims, 5 Drawing Sheets

HEAT DISSIPATION DEVICE

RELATED APPLICATIONS

This application claims priority to U.S. Provisional Application Ser. No. 63/323,298, filed Mar. 24, 2022, the disclosures of which are incorporated herein by reference in their entireties.

TECHNICAL FIELD

The present disclosure relates to a heat dissipation device. More particularly, the present disclosure relates to a heat dissipation device having a detachable upper heat dissipation module.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the central processing unit and other electronic components operating at a proper temperature, a liquid cooling device or an air cooling device is usually used.

In addition, due to the increasing number of cores of the central processing unit, the memory capacity is also increasing and faster. When the heat generated by the central processing unit is increasing, the volume and performance of the required cooling device must also increase. Therefore, the heat dissipation area of the heat dissipation fins required by the computer device is also gradually increased.

In general, an increase of the memory capacity of the computer device can effectively improve the overall performance of the computer device. Therefore, when the computer device freezes or crashes, users often have to upgrade or replace the memory of the computer device.

The memory of the computer device is generally installed next to the central processing unit, and therefore larger cooling fins may affect the replacement of the memory as well as smaller cooling fins may affect the cooling efficiency of the central processing unit.

Therefore, there is a need to improve the heat dissipation efficiency of the central processing unit and facilitate users to replace the memory so as to effectively reduce the operating temperature of the central processing unit and improve the working efficiency of the overall computer device.

SUMMARY

The summary of the present invention is intended to provide a simplified description of the disclosure to enable readers to have a basic understanding of the disclosure. The summary of the present invention is not a complete overview of the disclosure, and it is not intended to point out the importance of the embodiments/key elements of the present invention or define the scope of the invention.

One objective of the embodiments of the present invention is to provide a heat dissipation device able to increase the heat dissipation efficiency of the heat dissipation device and further improve the heat dissipation efficiency of the overall computer device.

To achieve these and other advantages and in accordance with the objective of the embodiments of the present invention, as the embodiment broadly describes herein, the embodiments of the present invention provides a heat dissipation device including a main fixed base plate, a main heat pipe set, a lower heat dissipation fin set, and an upper heat dissipation module. The main heat pipe set is fixed on the main fixed base plate, the lower heat dissipation fin set is fixed on the main fixed base plate, and the main heat pipe set passes through the lower heat dissipation fin set and is exposed on the lower heat dissipation fin set. In addition, the upper heat dissipation module is detachably installed on the lower heat dissipation fin set and contacts the main heat pipe set.

In some embodiments, the upper heat dissipation module includes an upper main heat dissipation fin set and at least one auxiliary heat dissipation fin set disposed on a side of the upper main heat dissipation fin set.

In some embodiments, the auxiliary heat dissipation fin set includes a first auxiliary heat dissipation fin set and a second auxiliary heat dissipation fin set. In addition, the first auxiliary heat dissipation fin set and the second auxiliary heat dissipation fin set are respectively disposed on two sides of the upper main heat dissipation fin set, and a thickness of the upper main heat dissipation fin set is less than or equal to a thickness of the first auxiliary heat dissipation fin set and a thickness of the second auxiliary heat dissipation fin set.

In some embodiments, the upper heat dissipation module further includes an upper heat pipe set passing through the first auxiliary heat dissipation fin set, the upper main heat dissipation fin set and the second auxiliary heat dissipation fin set.

In some embodiments, the upper heat dissipation module further includes an upper fixing base plate to fix the upper heat pipe set, and the upper fixing base plate includes a plurality of openings.

In some embodiments, the upper heat pipe set includes a plurality of upper heat pipes, each of the upper heat pipes includes a first part, a second part and a third part, and the second parts of the upper heat pipes are disposed at equal intervals on the upper fixing base plate and exposed to the openings.

In some embodiments, the upper heat dissipation module further includes an upper heat conduction block and a thermal pad. The upper heat conduction block directly contacts the upper heat pipes through the openings and the thermal pad is disposed between the upper heat conduction block and the main heat pipe set to transfer the heat in the main heat pipe set to the upper heat conduction block.

In some embodiments, the main heat pipe set includes a plurality of main heat pipes, and each of the main heat pipes includes a first part, a second part and a third part. In addition, the first part is fixed on the main fixed base plate, the second part is a rising portion to upwardly transfer a heat absorbed by the first part to the third part, and the third part is exposed to the lower heat dissipation fin set and contacts the upper heat dissipation module.

In some embodiments, the main heat pipes include a first main heat pipe and a second main heat pipe. The first part of the second main heat pipe is fixed beside the first part of the first main heat pipe and forms an U-shaped portion.

In some embodiments, the main heat pipes further include a third main heat pipe and a first part of the third main heat pipe is disposed in the U-shaped portion formed by the first part of the second main heat pipe.

In some embodiments, the heat dissipation device further includes a main heat conduction block fixed under the main fixed base plate to contact the main heat pipe set through the openings of the main fixed base plate.

In some embodiments, the heat dissipation device further includes a plurality of fixing crossbars disposed on the lower heat dissipation fin set and between main heat pipes of the main heat pipe set to fix the upper heat dissipation module.

Hence, the heat dissipation device may effectively increase the heat dissipation area of the heat dissipation fins and facilitate the user to install the memory, and at the same time improve the heat dissipation efficiency of the central processing unit and the memory, thereby improving the overall performance of the computer device.

BRIEF DESCRIPTION OF THE DRAWINGS

The disclosure can be more fully understood by reading the following detailed description of the embodiment, with reference made to the accompanying drawings as follows.

DETAILED DESCRIPTION OF THE PREFERRED EMBODIMENT

Figure 1:
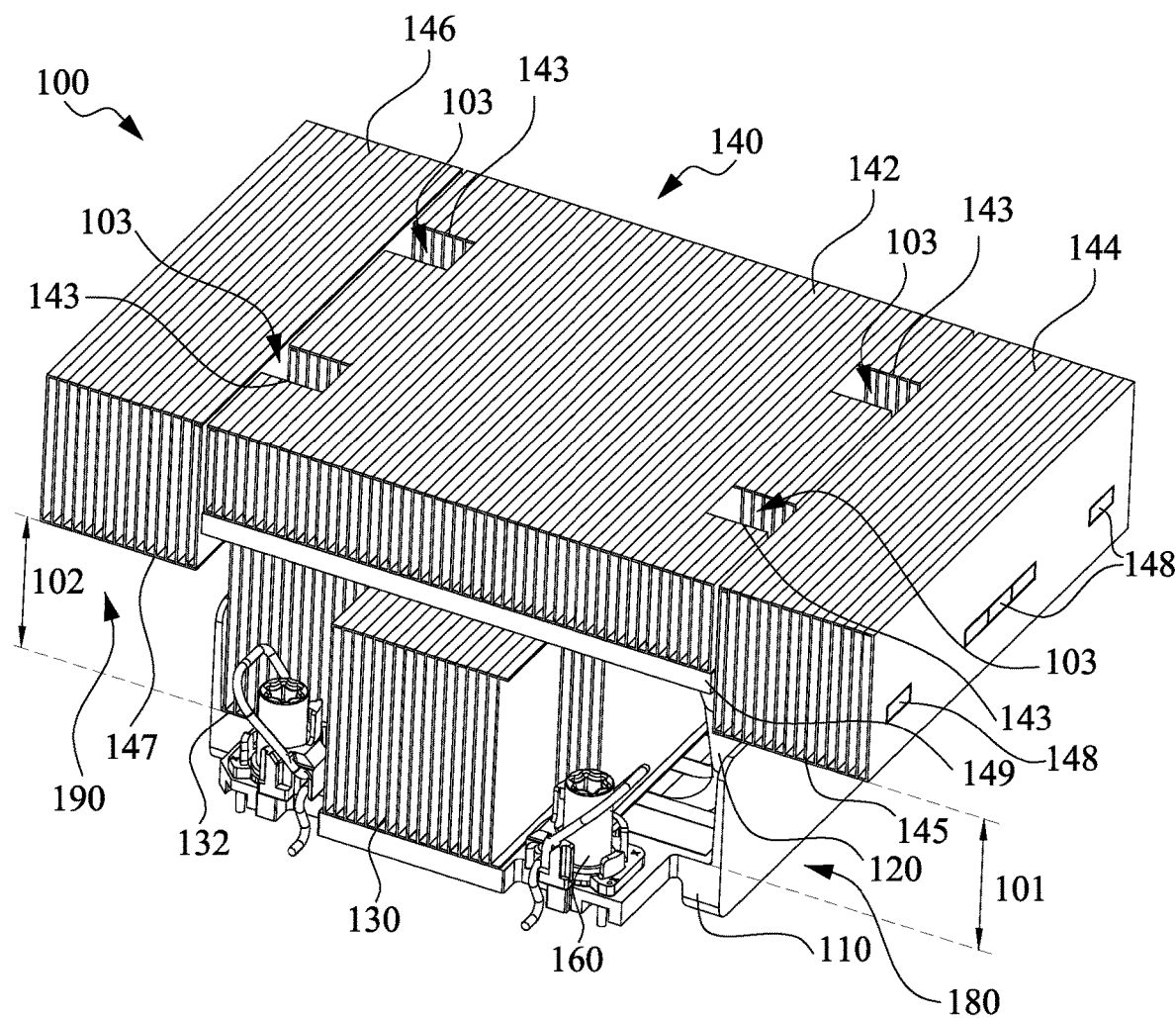
FIG. 1 illustrates a schematic perspective diagram of a heat dissipation device according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
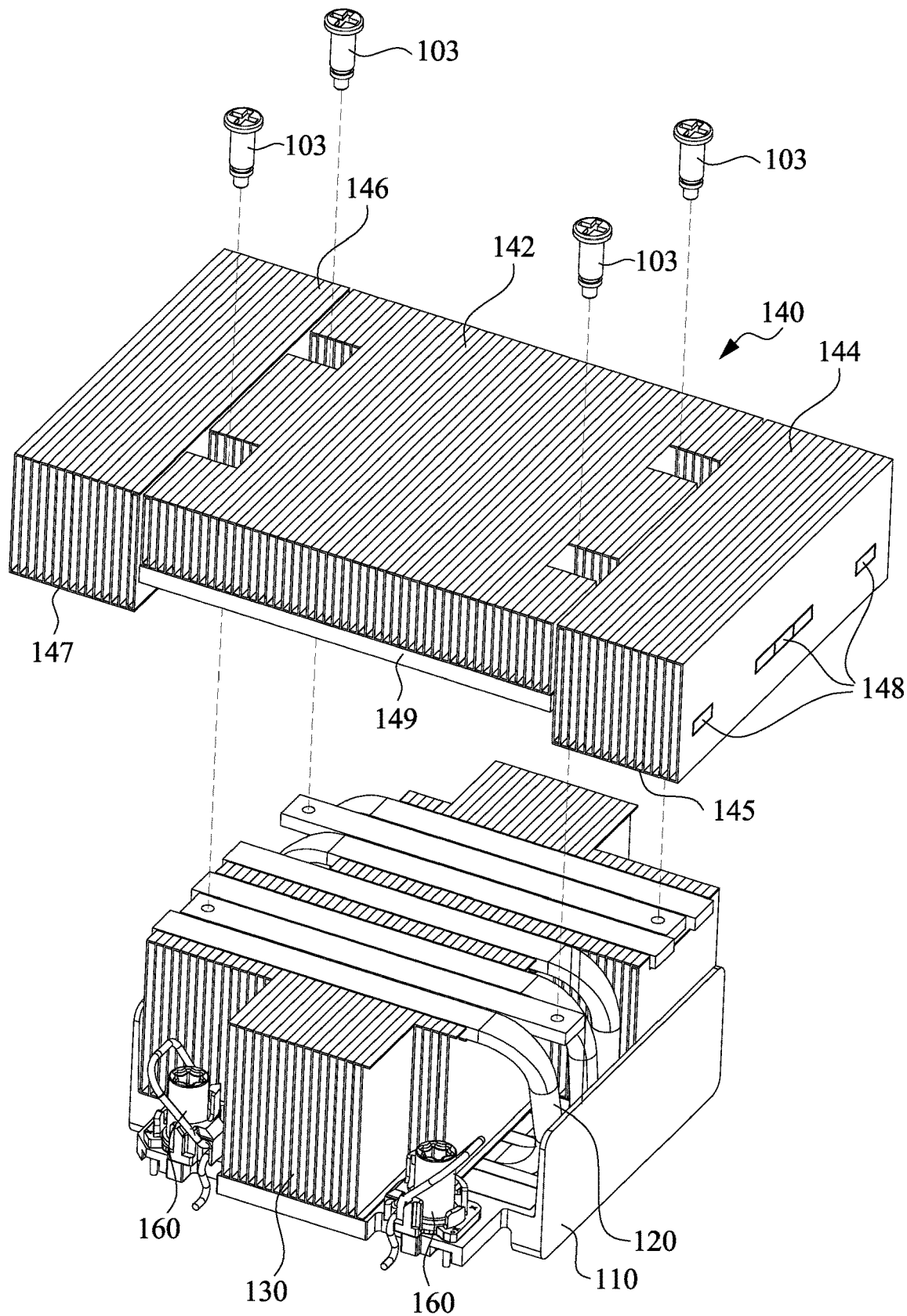
FIG. 2 is a schematic diagram of the heat dissipation device of FIG. 1 in a separated status.
Figure 3:
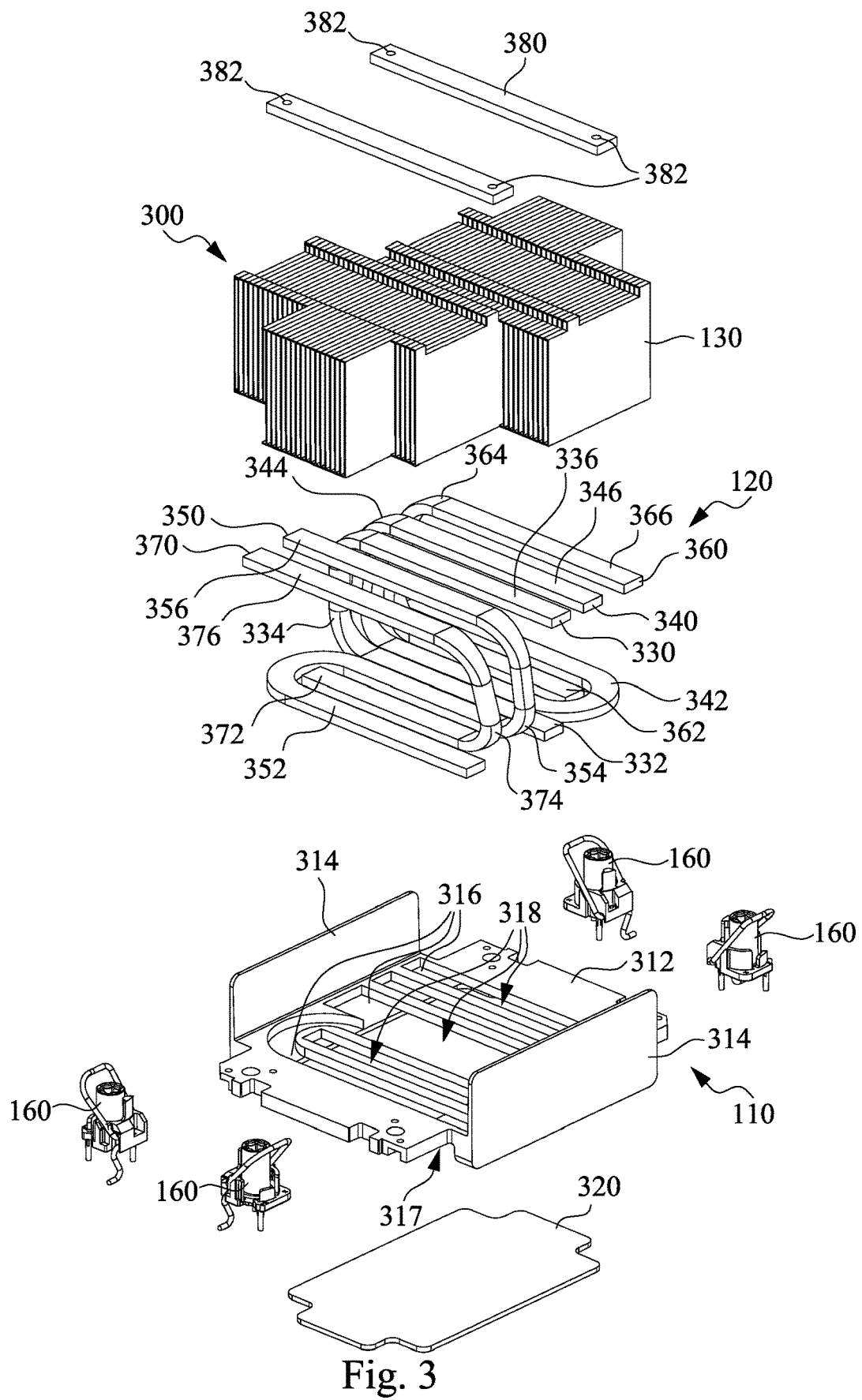
FIG. 3 is an exploded schematic diagram of a main heat dissipation module of the heat dissipation device of FIG. 1.
Figure 4:
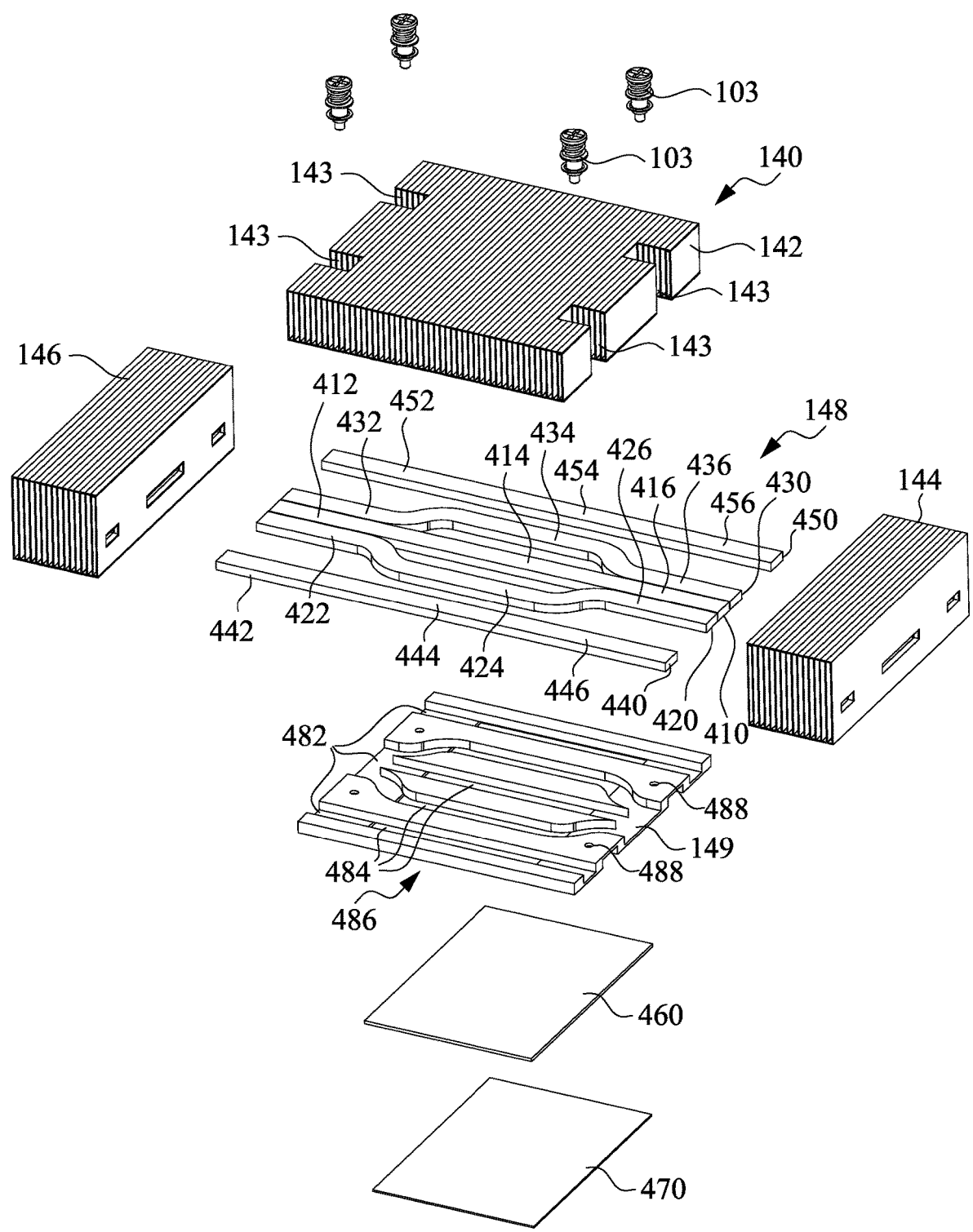
FIG. 4 is an exploded schematic diagram of an upper heat dissipation module of the heat dissipation device of FIG. 1.
Figure 5:
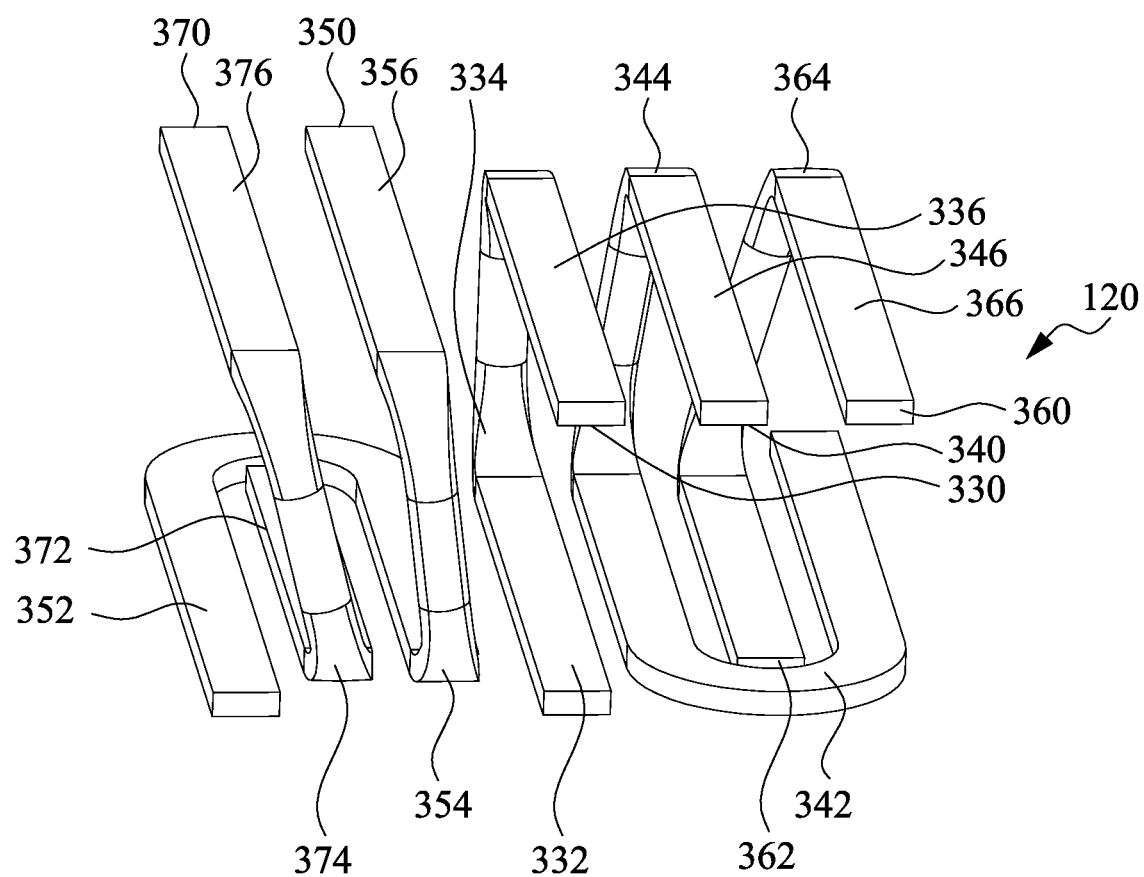
FIG. 5 is a schematic perspective diagram of the main heat pipe set of the main heat dissipation module of FIG. 3 viewed from another angle.

FIG. 1 illustrates a schematic perspective diagram of a heat dissipation device, FIG. 2 illustrates the heat dissipation device in a separated status, FIG. 3 is an exploded schematic diagram of a main heat dissipation module of the heat dissipation device, FIG. 4 is an exploded schematic diagram of an upper heat dissipation module of the heat dissipation device, and FIG. 5 is a schematic perspective diagram of the main heat pipe set of the main heat dissipation module viewed from another angle.

First referring to FIG. 1 and FIG. 2, as shown in the drawings, the heat dissipation device 100 includes a main fixed base plate 110, a main heat pipe set 120, a lower heat dissipation fin set 130 and an upper heat dissipation module 140. The main heat pipe set 120 is fixed on the main fixed base plate 110, the lower heat dissipation fin set 130 is also fixed on the main fixed base plate 110, and the main heat pipe set 120 passes through the lower heat dissipation fin set 130 and is exposed on the lower heat dissipation fin set 130. The upper heat dissipation module 140 is detachably installed on the lower heat dissipation fin set 130 and contacts the main heat pipe set 120.

In some embodiments, the upper heat dissipation module 140 includes an upper main heat dissipation fin set 142 and at least one auxiliary heat dissipation fin set, e.g. a first auxiliary heat dissipation fin set 144 and a second auxiliary heat dissipation fin set 146, disposed on two sides of the upper main heat dissipation fin set 142, and the thickness of the upper main heat dissipation fin set 142 is less than or equal to the thickness of the first auxiliary heat dissipation fin set 144 and the thickness of the second auxiliary heat dissipation fin set 146.

In some embodiments, a height of at least one auxiliary heat dissipation fin set bottom of an auxiliary heat dissipation fin set is higher than a height of a lower heat dissipation fin set bottom 132 of the lower heat dissipation fin set 130 about a height difference to form a storage space under the auxiliary heat dissipation fin set bottom. For example, the height of the first auxiliary heat dissipation fin set bottom 145 of the first auxiliary heat dissipation fin set 144 is higher than the height of the lower heat dissipation fin set bottom 132 of the lower heat dissipation fin set 130 about a first height difference 101, so that a first storage space 180 is formed under the first auxiliary heat dissipation fin set bottom 145. In addition, the height of the second auxiliary heat dissipation fin set bottom 147 of the second auxiliary heat dissipation fin set 146 is also higher than the height of the lower heat dissipation fin set bottom 132 of the lower heat dissipation fin set 130 about a second height difference 102, so that a second storage space 190 is formed under the second auxiliary heat dissipation fin set bottom 147. In some embodiments, the height of the first auxiliary heat dissipation fin set bottom 145 may be equal to the height of the second auxiliary heat dissipation fin set bottom 147, or may not be equal to the height of the second auxiliary heat dissipation fin set bottom 147, without departing from the spirit and protection scope of the present invention.

The first storage space 180 and the second storage space 190 may be configured to install the memory located on two sides of the main fixed base plate 110, and the upper heat dissipation module 140 can be detached from the lower heat dissipation fin set 130 while installing or removing the memory. Therefore, the upper heat dissipation module 140 may not affect the installation process or removal process of the memory. The user may conveniently replace the memory to effectively upgrade the memory without removing the entire heat dissipation device 100 installed on the central processing unit so as to improve the convenience of memory upgrade.

In some embodiments, the memory may be a double data rate synchronous dynamic random access memory (DDR SDRAM), such as but not limited to DDR4 SDRAM or DDR5 SDRAM, to improve the data transfer rate of the memory.

Further referring to FIG. 3, the heat dissipation device 100 further includes a main heat conduction block 320 and a plurality of fixing crossbars 380. The main fixed base plate 110, the main heat pipe set 120, the lower heat dissipation fin set 130, the main heat conduction block 320 and the fixing crossbars 380 form a main heat dissipation module 300. The main heat dissipation module 300 utilizes fixing screws 160 to fix the heat dissipation device 100 on a heat source, for example, the main fixed base plate 110 is fixed on a circuit board to allow the main heat conduction block 320 under the main fixed base plate 110 being in contact with the central processing unit on the circuit board.

In some embodiments, a thermal paste is applied between the main heat conduction block 320 and the central processing unit to improve the heat dissipation efficiency of the heat dissipation device 100.

In some embodiments, the main fixed base plate 110 includes a supporting bottom plate 312 and two side plates 314 respectively located on two sides of the supporting bottom plate 312 to guide the cooling airflow. In addition, the supporting bottom plate 312 includes a plurality of grooves 316 formed on the supporting bottom plate 312, a groove 317 formed under the supporting bottom plate 312, and a plurality of openings 318 to expose the main heat pipe set 120 for directly contacting the main heat conduction block 320.

The main heat conduction block 320 is fixed in the groove 317 under the main fixed base plate 110, and the main heat conduction block 320 directly contacts the main heat pipe set 120 through the openings 318 of the main fixed base plate 110. The heat pipes of the main heat pipe set 120 are fixed in the grooves 316 on the supporting bottom plate 312.

In some embodiments, the openings 318 communicate with the grooves 316 the groove 317, and are located between the grooves 316 and the groove 317.

In some embodiments, the fixing crossbars 380 are disposed on the lower heat dissipation fin set 130, and are located between the heat pipes of the main heat pipe set 120, so that the upper heat dissipation module 140 is detachably fixed on the main heat dissipation module 300.

In some embodiments, the fixing crossbars 380 respectively includes a plurality of fixing holes 382 to fix the upper heat dissipation module 140 on the fixing crossbars 380 with fixing screws 103.

In some embodiments, the main heat pipe set 120 includes a plurality of main heat pipes such as a first main heat pipe 330, a second main heat pipe 340, a third main heat pipe 350, a fourth main heat pipe 360 and a fifth main heat pipe 370. Each heat pipe includes a first part, a second part and a third part.

In general, the first part of the main heat pipe passes through the groove 316 and is exposed to the opening 318 to absorb the heat, generated by the central processing unit, in the main fixed base plate 110 and the main heat conduction block 320. The second part is a rising portion to upwardly transfer the heat absorbed by the main heat pipe to a top portion of the lower heat dissipation fin set 130, and the third part is exposed on the lower heat dissipation fin set 130 to directly contact the upper heat dissipation module 140. Therefore, the heat may be dissipated simultaneously through the lower heat dissipation fin set 130 and the upper heat dissipation module 140 by a fan or the like.

In some embodiments, referring to FIG. 3 and FIG. 5, the first part 332 of the first main heat pipe 330 passes through a central position of the main fixed base plate 110, and the first part 342 of the second main heat pipe 340 and the first part 352 of the third main heat pipe 350 are fixed on two sides of the first part 332 of the first main heat pipe 330, and respective form U-shaped portions surrounded in the grooves 316 of the main fixed base plate 110. In addition, the first part 362 of the fourth main heat pipe 360 is disposed in the U-shaped portion formed by the first part 342 of the second main heat pipe 340, and the first part 372 of the fifth main heat pipe 370 is disposed in the U-shaped portion formed by the first part 352 of the third main heat pipe 350.

Furthermore, the second part 334 of the first main heat pipe 330, the second part 344 of the second main heat pipe 340, the second part 354 of the third main heat pipe 350, the second part 364 of the fourth main heat pipe 360 and the second part 374 of the fifth main heat pipe 370 are upwardly extended a predetermined distance and are close to the top surface of the lower heat dissipation fin set 130.

In some embodiments, the third part 346 of the second main heat pipe 340 and the third part 356 of the third main heat pipe 350 are respectively disposed on two sides of the third part 336 of the first main heat pipe 330, and the third part 366 of the fourth main heat pipe 360 and the third part 376 of the fifth main heat pipe 370 are located outsides the third part 336 of the first main heat pipe 330, the third part 346 of the second main heat pipe 340 and the third part 356 of the third main heat pipe 350.

By way of the third part 336 of the first main heat pipe 330, the third part 346 of the second main heat pipe 340, the third part 356 of the third main heat pipe 350, the third part 366 of the fourth main heat pipe 360 and the third part 376 of the fifth main heat pipe 370, the heat may further transfer to the upper heat dissipation module 140 so as to effectively remove the heat from the lower heat dissipation fin set 130 and the upper heat dissipation module 140 through a fan or the like.

Also referring to FIG. 4, the upper heat dissipation module 140 includes an upper main heat dissipation fin set 142, a first auxiliary heat dissipation fin set 144, a second auxiliary heat dissipation fin set 146, an upper heat pipe set 148, an upper fixing base plate 149 and an upper heat conduction block 460. The upper heat pipe set 148 passes through the first auxiliary heat dissipation fin set 144, the upper main heat dissipation fin set 142 and the second auxiliary heat dissipation fin set 146. The upper fixing base plate 149 is utilized to fix the upper heat pipe set 148 and the upper main heat dissipation fin set 142, and the upper fixing base plate 149 includes a plurality of grooves 482, a plurality of openings 484 and a groove 486. The grooves 482 are formed on the upper fixing base plate 149, and the upper heat pipe set 148 is disposed through the grooves 482 and exposed to the openings 484 so as to directly contact the upper heat conduction block 460 under the upper fixing base plate 149. The groove 486 is formed under the upper fixing base plate 149 for accommodating the upper heat conduction block 460.

In some embodiments, the openings 484 communicate with the grooves 482 and the groove 486, and are located between the grooves 482 and the groove 486.

In some embodiments, the upper main heat dissipation fin set 142 includes perforations 143 to allow fixing screws 103 passing through the upper main heat dissipation fin set 142, and the upper fixing base plate 149 further includes a plurality of through holes 488 to allow the fixing screws 103 passing through the upper fixing base plate 149 and then fixing in fixing holes 382 of the fixing crossbars 380 to fix the upper fixing base plate 149 on the fixing crossbars 380 of the main heat dissipation module 300 so as to fix the upper heat dissipation module 140 on the main heat dissipation module 300.

In some embodiments, the upper heat pipe set 148 includes a plurality of upper heat pipes, for example, a first upper heat pipe 410, a second upper heat pipe 420, a third upper heat pipe 430, a fourth upper heat pipe 440 and a fifth upper heat pipe 450. Each of the upper heat pipes includes a first part, a second part and a third part. In some embodiments, the first part, the second part and the third part of the upper heat pipe are horizontally disposed.

In some embodiments, the second part 414 of the first upper heat pipe 410, the second part 424 of the second upper heat pipe 420, the second part 434 of the third upper heat pipe 430, the second part 444 of the fourth upper heat pipe 440 and the second part 454 of the fifth upper heat pipe 450 are disposed at equal intervals on the upper fixing base plate 149 and exposed to the openings 484 to directly contact the upper heat conduction block 460.

In some embodiments, the first part 412 of the first upper heat pipe 410, the first part 422 of the second upper heat pipe 420 and the first part 432 of the third upper heat pipe 430 are disposed side by side, and the third part 416 of the first upper heat pipe 410, the third part 426 of the second upper heat pipe 420 and the third part 436 of the third upper heat pipe 430 are disposed side by side. In addition, the first part 442, the second part 444 and the third part 446 of the fourth upper heat pipe 440 are arranged in a straight line and are located outside the second upper heat pipe 420. The first part 452, the second part 454 and the third part 456 of the fifth upper heat pipe 450 are also arranged in a straight line and are located outside the third upper heat pipe 430.

In some embodiments, the upper heat dissipation module 140 further includes a thermal pad 470 disposed between the upper heat conduction block 460 and the main heat pipe set 120 to transfer the heat in the main heat pipe set 120 to the upper heat conduction block 460.

In some embodiments, the thermal pad 470 is a thermal pad formed by the thermal paste but not limit to this.

Accordingly, the heat dissipation device may effectively increase the heat dissipation area of the heat dissipation fins and facilitate the user to install the memory, and at the same time improve the heat dissipation efficiency of the central processing unit and the memory, thereby improving the overall performance of the computer device.

Although the present disclosure has been disclosed above in terms of implementation, it is not intended to limit the present disclosure. Any person with ordinary knowledge in the field may make various variations and modifications without departing from the spirit and scope of the disclosure. Therefore, the spirit and scope of the appended claims should not be limited to the description of the embodiments contained herein.

What is claimed is:

1. A heat dissipation device, comprising:
    a main fixed base plate;
    a main heat pipe set fixed on the main fixed base plate;
    a lower heat dissipation fin set fixed on the main fixed base plate, and the main heat pipe set passing through the lower heat dissipation fin set and exposed on the lower heat dissipation fin set;
    an upper heat dissipation module detachably installed on the lower heat dissipation fin set and contacting the main heat pipe set;
    an upper main heat dissipation fin set;
    at least one auxiliary heat dissipation fin set disposed on a side of the upper main heat dissipation fin set;
    a first auxiliary heat dissipation fin set and a second auxiliary heat dissipation fin set respectively disposed on two sides of the upper main heat dissipation fin set, and a thickness of the upper main heat dissipation fin set is less than or equal to a thickness of the first auxiliary heat dissipation fin set and a thickness of the second auxiliary heat dissipation fin set; and
    an upper heat pipe set passing through the first auxiliary heat dissipation fin set, the upper main heat dissipation fin set and the second auxiliary heat dissipation fin set.

2. The heat dissipation device of claim 1, wherein the upper heat dissipation module further comprises:
    an upper fixing base plate fixing the upper heat pipe set, wherein the upper fixing base plate comprises a plurality of openings.

3. The heat dissipation device of claim 2, wherein the upper heat pipe set comprises:
    a plurality of upper heat pipes, wherein each of the upper heat pipes comprises a first part, a second part and a third part, wherein second parts of the upper heat pipes are disposed at equal intervals on the upper fixing base plate and exposed to the openings.

4. The heat dissipation device of claim 3, wherein the upper heat dissipation module further comprises:
    an upper heat conduction block directly contacting the upper heat pipes through the openings; and
    a thermal pad disposed between the upper heat conduction block and the main heat pipe set to transfer a heat in the main heat pipe set to the upper heat conduction block.

5. The heat dissipation device of claim 1, wherein the main heat pipe set comprises:
    a plurality of main heat pipes, wherein each of the main heat pipes comprises a first part, a second part and a third part, wherein the first part is fixed on the main fixed base plate, the second part is a rising portion to upwardly transfer a heat absorbed by the first part to the third part, and the third part is exposed to the lower heat dissipation fin set and contacts the upper heat dissipation module.

6. The heat dissipation device of claim 5, wherein the main heat pipes comprise:
    a first main heat pipe; and
    a second main heat pipe, wherein a first part of the second main heat pipe is fixed beside a first part of the first main heat pipe and forms an U-shaped portion.

7. The heat dissipation device of claim 6, wherein the main heat pipes further comprise:
    a third main heat pipe, wherein a first part of the third main heat pipe is disposed in the U-shaped portion formed by the first part of the second main heat pipe.

8. The heat dissipation device of claim 1, further comprising:
    a main heat conduction block fixed under the main fixed base plate to contact the main heat pipe set through openings of the main fixed base plate.

9. The heat dissipation device of claim 1, further comprising:
    a plurality of fixing crossbars disposed on the lower heat dissipation fin set and between main heat pipes of the main heat pipe set to fix the upper heat dissipation module.

* * * * *